(12) United States Patent
Kwak et al.

(10) Patent No.: US 6,753,232 B2
(45) Date of Patent: Jun. 22, 2004

(54) METHOD FOR FABRICATING SEMICONDUCTOR DEVICE

(75) Inventors: Noh-Yeal Kwak, Ichon-shi (KR); Sang Wook Park, Seoul (KR)

(73) Assignee: Hynix Semiconductor Inc., Ichon-shi (KR)

( * ) Notice: Subject to any disclaimer, the term of this patent is extended or adjusted under 35 U.S.C. 154(b) by 86 days.

(21) Appl. No.: 10/139,329

(22) Filed: May 7, 2002

(65) Prior Publication Data
US 2003/0003670 A1 Jan. 2, 2003

(30) Foreign Application Priority Data
Jun. 28, 2001 (KR) .......................................... 2001-37473

(51) Int. Cl.[7] .............................................. H01L 21/336
(52) U.S. Cl. ...................................... 438/301; 438/305
(58) Field of Search ................................. 438/301, 303, 438/305, 306, 199, 286

(56) References Cited

U.S. PATENT DOCUMENTS 5,237,188 A * 8/1993 Iwai et al. .................. 257/325
5,648,287 A * 7/1997 Tsai et al. ................... 438/305
6,171,889 B1 * 1/2001 Iwamatsu et al. ........... 438/162
6,555,438 B1 * 4/2003 Wu ............................. 438/305

* cited by examiner

Primary Examiner—Long Pham
Assistant Examiner—(Vikki) Hoa B. Trinh
(74) Attorney, Agent, or Firm—Finnegan, Henderson, Farabow, Garrett & Dunner, L.L.P.

(57) ABSTRACT

The present invention discloses a method for fabricating a semiconductor device. A stabilized junction is formed by simultaneously adjusting diffusion in a channel direction and a depth direction by restricting transient enhanced diffusion and oxidation enhanced diffusion, and reducing a short channel effect and diffusion in the depth direction, by positioning a nitrified oxide film between a gate electrode and a nitride film spacer formed at side walls of the gate electrode in order to remove defects generated due to stress differences between the gate electrode and the nitride film spacer in a formation process of a PMOS transistor. It is thus possible to form a device having an ultra shallow junction which is not influenced by miniaturization.

13 Claims, 3 Drawing Sheets

US 6,753,232 B2

METHOD FOR FABRICATING SEMICONDUCTOR DEVICE

BACKGROUND OF THE INVENTION

1. Field of the Invention

The present invention relates to a method for fabricating a semiconductor device. More specifically, it relates to an improved method for forming an ultra shallow junction in a PMOS device by positioning a screen oxide film to which an inert gas is ion-implanted between a gate electrode and a nitride film spacer.

2. Description of the Background Art

In current methods for making PMOS devices, nitride film spacers are used to obtain a channel length and protect an electrode. Stress differences between polysilicon and the nitride material cause problems, however. In order to solve this problem, an oxide film is formed between the nitride film spacer and the polysilicon. However, it is difficult to selectively deposit the oxide film on a predetermined portion.

The nitride film spacer is formed by depositing a nitride film on the oxide film, and performing a full etching process thereon. Thereafter, an impurity junction region is formed according to an ion implant process using the appropriate dopants. Here, defects of p-type dopants are generated due to low solubility in semiconductor substrates that are composed of silicon, and due to transient enhanced diffusion (TED) of the p-type dopants.

After the ion implant process for forming p+ source/drain regions, unwanted diffusion in the channel length direction and punch-through in the depth direction may occur. Diffusion by the p-type dopants reduces the effective channel length. Oxidative enhanced diffusion (OED) of the oxide film between the gate electrode and the nitride film spacer in the depth direction causes the punch-through.

Conventional PMOS devices employ a buried channel, which is a channel formed by a depletion mode in the channel region using n+ poly silicon layers. However, threshold voltage adjusting dopants and junction forming dopants can diffuse in the depth direction due to the TED phenomenon during a succeeding annealing process. This can also deteriorate the quality of the gate insulating film.

Alternatively, p+ source/drain regions in PMOS transistors have been formed using $BF_2$ ions. However, $F_{19}$ ions in $BF_2$ ions also reduce quality of the gate insulating film. Specifically, $F_{19}$ ions are impurities that can cause defects in the transistor. For instance, $F_{19}$ ions can form a thin film between the oxide films deposited between the gate electrode and the nitride film spacer. This can reduce a stress resulting from the gate insulating film and the nitride film spacer for protecting the gate electrode. In addition, such growth defects can generate leakage current during the succeeding annealing process. Because the ion implant process for forming the p+ source/drain regions using $BF_2$ exposes the transistor to $F_{19}$ impurities, such problems from $F_{19}$ impurities are unavoidable.

SUMMARY OF THE INVENTION

The present invention provides an improved method for fabricating a semiconductor device. The method comprises forming a stabilized junction by simultaneously adjusting diffusion in a channel direction and a depth direction by restricting transient enhanced diffusion and oxidation enhanced diffusion, and reducing a short channel effect and diffusion in the depth direction, by positioning a nitrified oxide film between a gate electrode and a nitride film spacer formed at side walls of the gate electrode. The process helps to remove defects generated due to stress differences between the gate electrode and the nitride film spacer in a formation process of a PMOS transistor. It is thus possible to form a device having an ultra shallow junction which is not influenced by miniaturization.

The improved method comprises:

forming a gate insulating film on a semiconductor substrate;

forming a gate electrode on the gate insulating film;

forming a screen oxide film over the resulting structure;

implanting nitrogen ions to the screen oxide film;

depositing a nitride film for a spacer on the screen oxide film, and simultaneously performing an annealing process to nitrify the screen oxide film in which the nitrogen ions are implanted;

forming a spacer comprising the nitrified screen oxide film and the nitride film at side walls of the gate electrode, by removing the nitride film for the spacer and the nitrified screen oxide film; and forming p+ source/drain regions on the semiconductor substrate at both sides of the spacer.

In an embodiment of the present invention, the gate insulating film is formed at a thickness of 40 to 100 Å according to a wet oxidation process using hydrogen and oxygen at a temperature of 750 to 800° C., and to an annealing process in a nitrogen atmosphere of 800 to 950° C. for 20 to 30 minutes.

The gate electrode has a stacked structure of a p-type polysilicon layer, WNx layer and W layer.

The p-type polysilicon layer may be formed at a thickness of 700 to 1000 Å according to a low pressure chemical vapor deposition (LPCVD) process using a silicon source gas such as $SiH_4$ or $Si_2H_6$ and $POCl_3$ or $PH_3$ gas at a temperature of 510 to 550° C. under a pressure of 0.1 to 3.0 Torr.

The screen oxide film may be formed at a thickness of 100 to 150 Å according to the LPCVD process using a mixed gas of nitrogen, oxygen and hydrogen gases at a temperature of 600 to 750° C.

The ion implant process may be performed using dopant of $1 \times 10^{14}$ to $3 \times 10^{15}$ ions/$cm^2$ at a tilt of 30 to 60° C. with an ion implant energy of 0.5 to 5 keV.

The nitride film for the spacer may be deposited according to a chemical vapor deposition (CVD) process using $NH_3$ and DCS.

The p+ source/drain regions may be formed according to an ion implant process using $BF_2$ of $1 \times 10^{14}$ to $3 \times 10^{15}$ ions/$cm^2$ with an ion implant energy of 5 to 25 keV.

A rapid thermal process may be performed on the p+ source/drain regions in a nitrogen atmosphere of 800 to 950° C. increased at a speed of 50 to 150° C. after the ion implant process.

The principle of the present invention is to form the PMOS having a ultra shallow junction region by removing defects due to $F_{19}$ included in the screen oxide film formed between the gate electrode and the nitride film spacer by nitrifying the screen oxide film.

BRIEF DESCRIPTION OF THE DRAWINGS

The present invention will become better understood with reference to the accompanying figures which are given only by way of illustration and thus are not limitative of the present invention.

DETAILED DESCRIPTION OF THE PREFERRED EMBODIMENTS

A method for fabricating a semiconductor device in accordance with a preferred embodiment of the present invention will now be described in detail with reference to the accompanying drawings.

Figure 1A:
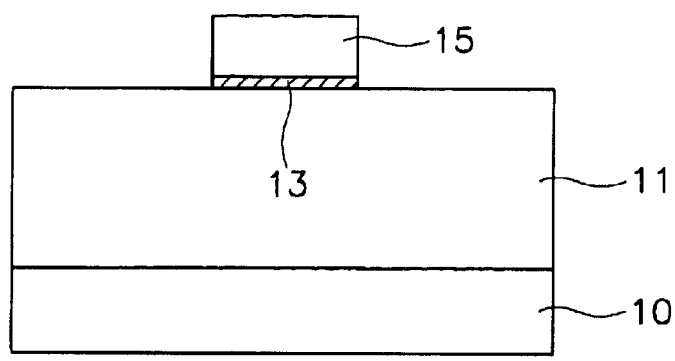
FIGS. 1A to 1C are cross-sectional diagrams illustrating sequential steps of a method for fabricating a semiconductor device in accordance with the present invention.
Figure 1B:
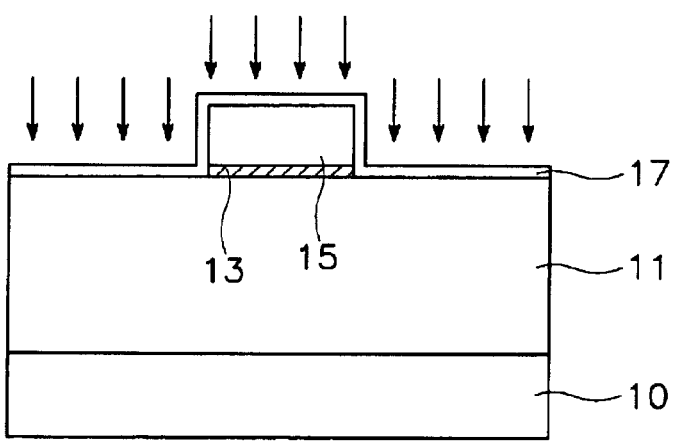
Figure 1C:
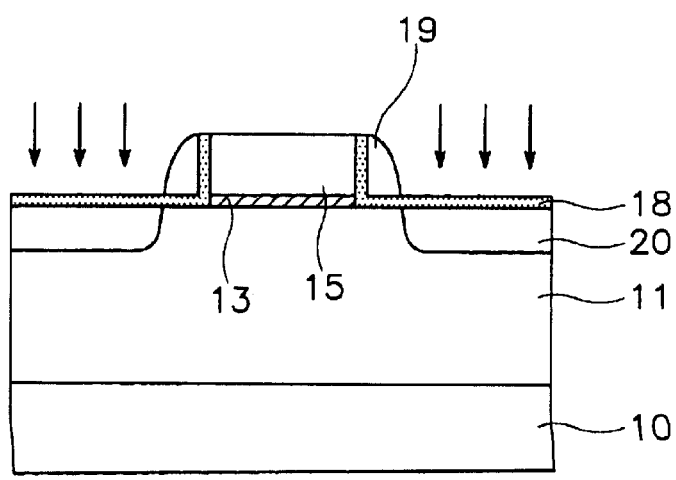

FIGS. 1A to 1C are cross-sectional diagrams illustrating sequential steps of the method for fabricating the semiconductor device in accordance with the present invention, especially formation of a PMOS transistor.

An n well 11 is formed by implanting n-type impurities to a predetermined region of a semiconductor substrate 10.

An element isolating insulating film (not shown) defining an active region is formed on the semiconductor substrate 10. The element isolating insulating film is formed according to a shallow trench isolation (STI) process, thereby maximizing a margin of the active region by miniaturization of the device, and stabilizing a well property.

Thereafter, a gate insulating film (not shown) is formed on the semiconductor substrate 10. Here, the surface of the semiconductor substrate 10 is cleaned by HF and SC-1 solution before forming the gate insulating film. The gate insulating film is formed at a thickness of 40 to 100 Å according to a wet oxidation process using hydrogen and oxygen at a temperature of 750 to 800° C., and an annealing process in a nitrogen atmosphere of 800 to 950° C. for 20 to 30 minutes.

A stacked structure of a p-type polysilicon layer, WNx layer and W layer is formed on the gate insulating film. Here, the p-type polysilicon layer is formed at a thickness of 700 to 1000 Å according to a low pressure chemical vapor deposition (LPCVD) process using a silicon source gas such as $SiH_4$ or $Si_2H_8$ and $POCl_3$ or $PH_3$ gas at a temperature of 510 to 550° C. under a pressure of 0.1 to 3.0 Torr.

A gate electrode 15 and a gate insulating film pattern 13 are formed by etching the stacked structure and the gate insulating film according to a photolithography process using a gate electrode mask (see FIG. 1A).

Thereafter, a screen oxide film 17 is formed over the resultant structure. Here, the screen oxide film 17 is formed at a thickness of 100 to 150 Å according to the LPCVD process using a mixed gas of nitrogen, oxygen and hydrogen gases at a temperature of 600 to 750° C.

Nitrogen ions are implanted into the whole surface of the screen oxide film 17. Here, the ion implant process is performed by using dopant of $1 \times 10^{14}$ to $3 \times 10^{15}$ ions/cm$^2$ at a tilt of 30 to 60° C. with an ion implant energy of 0.5 to 5 keV, so that the dopant is not implanted to the semiconductor substrate 10. The ion implant process is performed by plasma doping (see FIG. 1B).

A nitride film for a spacer (not shown) is formed over the resultant structure, an annealing process is performed at the same time to nitrify the screen oxide film 17. Here, the nitride film for the spacer is deposited according to a chemical vapor deposition (CVD) process using $NH_3$ and $DCS(SiH_2Cl_2)$.

A nitrified screen oxide film pattern 18 is formed at the side walls of the gate electrode 15 and the gate insulating film pattern 13 and the active region of the semiconductor substrate 10 by removing the nitride film for the spacer and the nitrified screen oxide film according to a full etching process, and a nitride film spacer 19 is formed on the nitrified screen oxide film pattern 18 at the side walls of the gate electrode 15 at the same time. Here, the screen oxide film pattern 18 with a small amount of ion-implanted nitrogen protects p+ source/drain regions formed in a succeeding process, and restricts out-diffusion of $F_{19}$, thereby reducing defects.

P+ impurities are ion-implanted to the semiconductor substrate 10 at both sides of the nitride film spacer 19. Here, the ion implant process is performed using $BF_2$ of $1 \times 10^{14}$ to $3 \times 10^{15}$ ions/cm$^2$ with an ion implant energy of 5 to 25 keV.

The P+ source/drain regions 20 are formed according to a rapid thermal process. The rapid thermal process is performed in a nitrogen atmosphere of 800 to 950° C. raised at a speed of 50 to 150° C. Here, the rapid thermal process is executed in the nitrogen atmosphere to restrict the TED of $B_{11}$ in the channel side.

Figure 2:
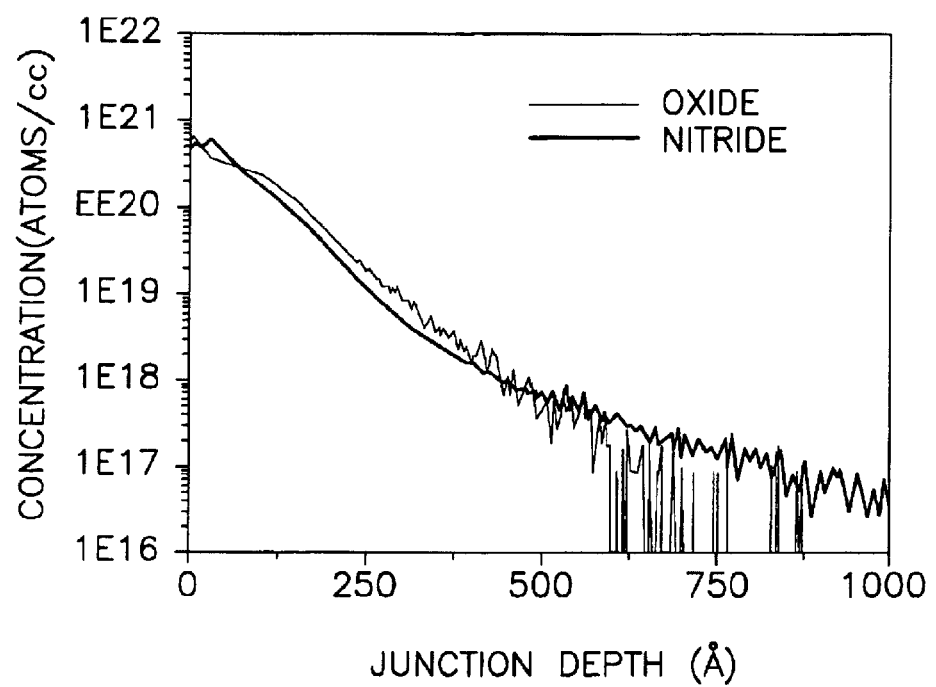
FIG. 2 is a graph showing variations of concentration by a junction depth after performing an ion implant process on a nitride film used as a screen insulating film and an oxide film.
Figure 3:
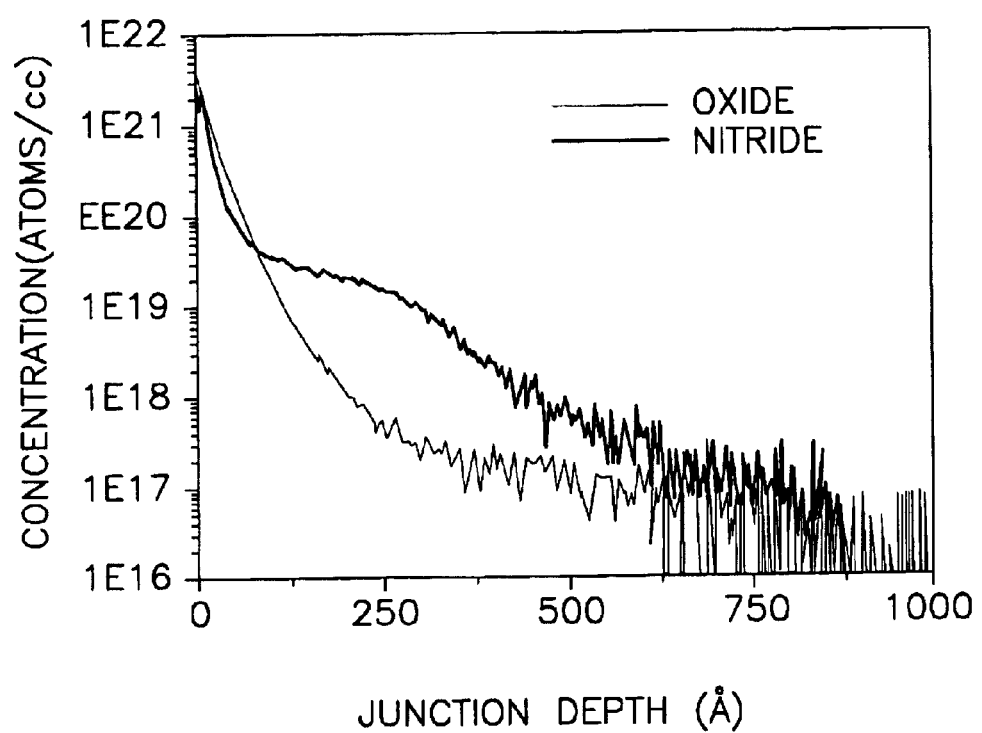
FIG. 3 is a graph showing variations of concentration by the junction depth after performing an annealing process after the ion implant process of FIG. 2.

FIG. 2 is a graph showing variations of concentration by a junction depth after performing the ion implant process on the nitride film used as the screen insulating film and the oxide film, and FIG. 3 is a graph showing variations of concentration by the junction depth after performing the annealing process after the ion implant process of FIG. 2. When the nitride film is used as the screen insulating film, the diffusion by the TED, especially by the OED, is restricted.

As discussed earlier, in accordance with the present invention, the stabilized junction is formed by simultaneously adjusting diffusion in the channel direction and depth direction by restricting the TED and the OED, and reducing a short channel effect and diffusion in the depth direction, by positioning the nitrified oxide film between the gate electrode and the nitride film spacer formed at the side walls of the gate electrode in order to remove defects generated due to stress difference between the gate electrode and the nitride film spacer in the formation process of the PMOS transistor. It is thus possible to embody the device which has the ultra shallow junction and which is not influenced by miniaturization.

As the present invention may be embodied in several forms without departing from the spirit or essential characteristics thereof, it should also be understood that the above-described embodiment is not limited by any of the details of the foregoing description, unless otherwise specified, but rather should be construed broadly within its spirit and scope as defined in the appended claims, and therefore all changes and modifications that fall within the metes and bounds of the claims, or equivalences of such metes and bounds are therefore intended to be embraced by the appended claims.

What is claimed is:

1. A method for fabricating a semiconductor device, comprising:

forming a gate insulating film on a semiconductor substrate;

forming a gate electrode on the gate insulating film;

forming a screen oxide film over the semiconductor substrate with the gate electrode formed thereover;

implanting nitrogen ions to the screen oxide film;

depositing a nitride film for a spacer on the screen oxide film, and simultaneously performing an annealing process to nitrify the screen oxide film in which the nitrogen ions are implanted;

forming a spacer comprising the nitrified screen oxide film and the nitride film at side walls of the gate electrode, by removing the nitride film for the spacer and the nitrified screen oxide film; and forming p+ source/drain regions on the semiconductor substrate at both sides of the spacer.

2. The method according to claim 1, wherein the gate insulating film is formed at a thickness of 40 to 100 Å according to a wet oxidation process using hydrogen and oxygen at a temperature of 750 to 800° C., and to an annealing process in a nitrogen atmosphere of 800 to 950° C. for 20 to 30 minutes.

3. The method according to claim 1, wherein the gate electrode has a stacked structure comprising a p-type polysilicon layer, WNx layer and W layer.

4. The method according to claim 3, wherein the p-type polysilicon layer is formed according to a low pressure chemical vapor deposition process.

5. The method according to claim 4, wherein said p-type polysilicon layer is formed at a thickness of 700 to 1000 Å.

6. The method according to claim 4, wherein said low pressure chemical vapor deposition process uses a silicon source gas selected from a group consisting of $SiH_4$ and $Si_2H_5$, or $POCl_3$ gas or $PH_3$ gas at a temperature of 510 to 550° C. under a pressure of 0.1 to 3.0 Torr.

7. The method according to claim 1, wherein the screen oxide film is formed according to a low pressure chemical vapor deposition process.

8. The method according to claim 7, wherein said screen oxide film is formed at a thickness of 100 to 150 Å.

9. The method according to claim 7, wherein said screen oxide film is formed using a mixed gas of nitrogen, oxygen and hydrogen gases at a temperature of 600 to 750° C.

10. The method according to claim 1, wherein the ion implant process is performed using a dopant of $1\times10^{14}$ to $3\times10^{15}$ ions/cm$^2$ at a tilt of 30 to 60° C. with an ion implant energy of 0.5 to 5 keV.

11. The method according to claim 1, wherein the nitride film for the spacer is deposited according to a chemical vapor deposition process using $NH_3$ and DOS.

12. The method according to claim 1, wherein the p+ source/drain regions are formed according to an ion implant process using $BF_2$ of $1\times10^{14}$ to $1\times10^{15}$ ions/cm$^2$ with an ion implant energy of 5 to 25 keV.

13. The method according to claim 1, wherein the p+ source/drain regions are formed according to a rapid thermal process in a nitrogen atmosphere of 800 to 950° C. increased at a speed of 50 to 150° C. after the ion implant process.

* * * * *